(12) United States Patent
Shin et al.

(10) Patent No.: US 7,595,747 B2
(45) Date of Patent: Sep. 29, 2009

(54) DIGITAL-TO-ANALOG CONVERTER, AND METHOD THEREOF

(75) Inventors: Yun Seung Shin, Seoul (KR); Ji Woon Jung, Gwangmyeong-si (KR); Myung Hee Lee, Seoul (KR)

(73) Assignee: Samsung Electroncis Co., Ltd, Suwon-si (KR)

( * ) Notice: Subject to any disclaimer, the term of this patent is extended or adjusted under 35 U.S.C. 154(b) by 0 days.

(21) Appl. No.: 11/971,320

(22) Filed: Jan. 9, 2008

(65) Prior Publication Data

US 2008/0191916 A1 Aug. 14, 2008

(30) Foreign Application Priority Data

Feb. 14, 2007 (KR) .................... 10-2007-0015212

(51) Int. Cl.
*H03M 1/66* (2006.01)

(52) U.S. Cl. ...................... 341/145; 341/144

(58) Field of Classification Search ................ 341/154, 341/144, 155, 145, 150
See application file for complete search history.

(56) References Cited

U.S. PATENT DOCUMENTS

| | | | | |
|---|---|---|---|---|
| 5,914,682 | A * | 6/1999 | Noguchi | 341/145 |
| 5,977,898 | A * | 11/1999 | Ling et al. | 341/144 |
| 6,268,817 | B1 * | 7/2001 | Min et al. | 341/145 |
| 7,453,386 | B2 * | 11/2008 | Jeon et al. | 341/145 |
| 2008/0024478 | A1 * | 1/2008 | Yoshioka et al. | 345/210 |
| 2008/0030489 | A1 * | 2/2008 | Kim et al. | 345/205 |

FOREIGN PATENT DOCUMENTS

| | | |
|---|---|---|
| JP | 2000-209093 | 7/2000 |
| JP | 2003-168978 | 6/2003 |
| JP | 2005-286522 | 10/2005 |
| KR | 1000880880000 | 3/1995 |

OTHER PUBLICATIONS

Office Action issued Oct. 29, 2008 in Korean Patent Application No. 2007-0015212.

* cited by examiner

*Primary Examiner*—Peguy JeanPierre
(74) *Attorney, Agent, or Firm*—Stanzione & Kim, LLP (57) ABSTRACT

A digital-to-analog converter (DAC) and a digital-to-analog converting method are provided. The DAC includes a first capacitor, an operation amplifier having a first input terminal connected to the first capacitor, a second input terminal, and an output terminal, where the first input terminal is a (−) input terminal and the second input terminal is a (+) input terminal; and a switching circuit having a plurality of switches each being switched in response to a corresponding switching signal from among a plurality of switching signals. The switching circuit performs switching so that the difference between a first voltage and a second voltage can be stored in the first capacitor connected to the operation amplifier during a first period, and performs switching so that an output signal can be output by reflecting a third voltage in the difference stored in the first capacitor during a second period.

18 Claims, 9 Drawing Sheets

DIGITAL-TO-ANALOG CONVERTER, AND METHOD THEREOF

CROSS-REFERENCE TO RELATED APPLICATIONS

This application claims priority under 35 U.S.C. §119(a) from Korean Patent Application No. 10-2007-0015212, filed on Feb. 14, 2007, in the Korean Intellectual Property Office, the disclosure of which is incorporated herein in its entirety by reference.

BACKGROUND OF THE INVENTION

1. Field of the Invention

The present general inventive concept relates to a digital-to-analog converter (DAC), and more particularly, to a DAC of a source driver circuit to drive a liquid crystal display (LCD) apparatus.

2. Description of the Related Art

A digital-to-analog converter (DAC) is a core block of a source driver circuit that drives a liquid crystal display (LCD) device.

In general, a source driver circuit mainly uses a resistor-based DAC (hereinafter referred to as "R-DAC").

Figure 1:
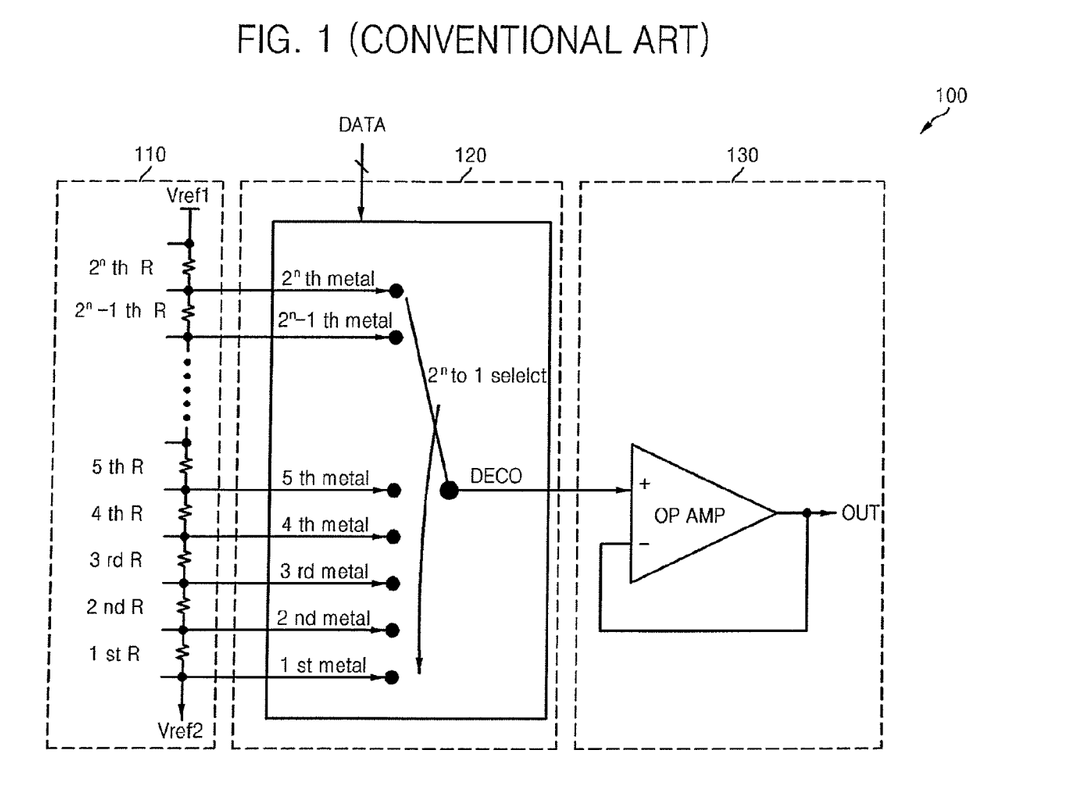
FIG. 1 is a circuit diagram illustrating a conventional digital-to-analog converter (DAC)

FIG. 1 is a circuit diagram illustrating a conventional R-DAC 100.

Referring to FIG. 1, the conventional DAC 100 includes a string of resistors 110, a decoder 120, and an amplifier (OP-AMP) 130. In order to generate a plurality of voltages, the string of the resistors 110 include a plurality of resistors $1^{st}$ R through $2^{n}$th R that are connected in series between a first node for receiving a first reference voltage Vref1 and a second node for receiving a second reference voltage Vref2 (Vref2<Vref1). The decoder 120 selects one of the voltages and outputs it as a selected voltage DECO, in response to an input digital signal DATA.

A DAC that converts 8-bit digital data DATA into an analog signal, i.e., an 8-bit DAC, requires $2^8(=256)$ resistors and $2^8$ metal lines. Accordingly, the decoder 120 is embodied as a 256:1 decoder capable of selecting a voltage from among 256 voltages.

As a bit value of the digital data DATA increases, a total numbers of resistors and metal lines required exponentially increase. For example, if the digital data DATA is 10 bits long, $1024(=2^{10})$ resistors, 1024 metal lines, and a 1024:1 decoder are needed.

The string of resistors 110 can be shared for all channels, but the decoder 120 and the amplifier 130 are prepared in channel units. Accordingly, a size (or area) of the DAC 100 is slightly influenced by an increase in the total number of the string of the resistors 110 but is significantly influenced by the size of the decoder 120. For example, a size of the 1024:1 decoder must be four times greater than a size of a 256:1 decoder, thus making it very difficult to manufacture a source driver. Also, a total number of metal lines via which a plurality of voltages that are divided by the string of the resistors 110 are transmitted to respective channels, is significantly increased, for example, from 256 to 1024, thereby also limiting to manufacturing of a source driver.

Therefore, there is a need for development of a method of reducing a total number of resistors and metal lines, and a size of a decoder in order to reduce a size of a DAC.

SUMMARY OF THE INVENTION

The present general inventive concept provides a digital-to-analog converter (DAC) with a reduced size, and a source driver having the same.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a DAC including a first capacitor, an operation amplifier having a first input terminal connected to the first capacitor, a second input terminal, and an output terminal, where the first input terminal is a (−) input terminal and the second input terminal is a (+) input terminal, and a switching circuit having a plurality of switches each being switched in response to a corresponding switching signal from among a plurality of switching signals.

The switching circuit transmits a first voltage to a first terminal of the first capacitor, transmits a second voltage to the second input terminal of the operation amplifier, and connects the first input terminal of the operation amplifier to the output terminal of the operation amplifier during a first period. Also, the switching circuit transmits a third voltage to the second input terminal of the operation amplifier, separates the first input terminal of the operation amplifier from the output terminal of the operation amplifier, and connects the first terminal of the first capacitor to the output terminal of the operation amplifier during a second period.

The DAC may further include a second capacitor connected to the second input terminal of the operation amplifier. The switching circuit may transmit the third voltage to a first terminal of the second capacitor during the second period so that the third voltage can be transmitted to the second input terminal of the operation amplifier via the second capacitor.

The DAC may further include a first voltage divider that has a string of resistors connected between a first node to receive a first reference voltage and a second node to receive a second reference voltage, and to generate a plurality of first divided voltages, a second voltage divider that has a string of resistors connected between a third node to receive a third reference voltage and a fourth node to receive a fourth reference voltage, and to generate a plurality of second divided voltages, a first decoder to output one of the first divided voltages as the second or third voltage, in response to a first digital signal which constitutes an input digital signal, and a second decoder that selects one of the second divided voltages and outputs the selected voltage as the third or second voltage, in response to a second digital signal which constitutes the digital signal.

The first digital signal may include one or more upper bits of the first and second digital signal, and the second digital signal may include one or more lower bits of the first and second digital signal.

The switching circuit may include a first switch connected between the first input terminal and the output terminal of the operation amplifier, a second switch connected in parallel to the second capacitor, a third switch to transmit the first voltage to the first terminal of the first capacitor, a fourth switch to transmit the second voltage to the first terminal of the second capacitor, a fifth switch to transmit the third voltage to the first terminal of the second capacitor, and a sixth switch being connected between the first terminal of the first capacitor and the output terminal of the operation amplifier.

The DAC may further include a controller to output the switching signals.

The foregoing and/or other aspects and utilities of the general inventive concept may also be achieved by providing a source driver, comprising a first capacitor, an operation amplifier having a first input terminal connected to the first capacitor, a second input terminal, and an output terminal, and a switching circuit having a plurality of switches each being switched in response to a corresponding switching signal from among a plurality of switching signals, wherein the switching circuit transmits a first voltage to a first terminal of the first capacitor, transmits a second voltage to the second input terminal of the operation amplifier, and connects the first input terminal of the operation amplifier to the output terminal of the operation amplifier during a first period; and then transmits a third voltage to the second input terminal of the operation amplifier, separates the first input terminal of the operation amplifier from the output terminal of the operation amplifier, and connects the first terminal of the first capacitor to the output terminal of the operation amplifier during a second period.

The foregoing and/or other aspects and utilities of the general inventive concept may also be achieved by providing a display device having a plurality of pixels that include a plurality of data lines and a plurality of gate lines, each of the pixels being connected between a corresponding data line from among the data lines and a corresponding gate line from among the gate lines, and a source driver including a first capacitor, an operation amplifier having a first input terminal connected to the first capacitor, a second input terminal, and an output terminal, and a switching circuit having a plurality of switches each being switched in response to a corresponding switching signal from among a plurality of switching signals, wherein the switching circuit transmits a first voltage to a first terminal of the first capacitor, transmits a second voltage to the second input terminal of the operation amplifier, and connects the first input terminal of the operation amplifier to the output terminal of the operation amplifier during a first period; and then transmits a third voltage to the second input terminal of the operation amplifier, separates the first input terminal of the operation amplifier from the output terminal of the operation amplifier, and connects the first terminal of the first capacitor to the output terminal of the operation amplifier during a second period. The voltage of or a signal output from the output terminal of the operation amplifier of the DAC is applied to a corresponding data line from among the data lines.

The foregoing and/or other aspects and utilities of the general inventive concept may also be achieved by providing a digital-to-analog converting method, the method including storing a difference between a first voltage corresponding to as predetermined reference voltage and a second voltage based on a first digital signal in a first capacitor connected to a first input terminal of an operation amplifier during a first period, and outputting an output signal by adding a third voltage based on a second digital signal to or subtracting the third voltage from the difference stored in the first capacitor during a second period.

The first digital signal may include one or more upper bits of the first and second digital signals, and the second digital signal may include one or more lower bits of the first and second digital signals.

The method may further include generating a plurality of first divided voltages by using a string of resistors to receive a first reference voltage and a second reference voltage, generating a plurality of second divided voltages by using a string of resistors to receive a third reference voltage and a fourth reference voltage, selecting one of the first divided voltages and outputting the selected voltage as the second or third voltage, in response to the first digital signal, and selecting one of the second divided voltages and outputting the selected voltage as the third or second voltage, in response to the second digital signal.

The foregoing and/or other aspects and utilities of the general inventive concept may also be achieved by providing a computer-readable recording medium having embodied thereon a computer program to execute a method, wherein the method including storing a difference between a first voltage corresponding to a predetermined reference voltage and a second voltage based on a first digital signal in a first capacitor connected to a first input terminal of an operation amplifier during a first period, and outputting an output signal by adding a third voltage based on a second digital signal to or subtracting the third voltage from the difference stored in the first capacitor during a second period.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, operations, elements, and/or components, but do not preclude the presence or addition of one or more other features, regions, integers, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
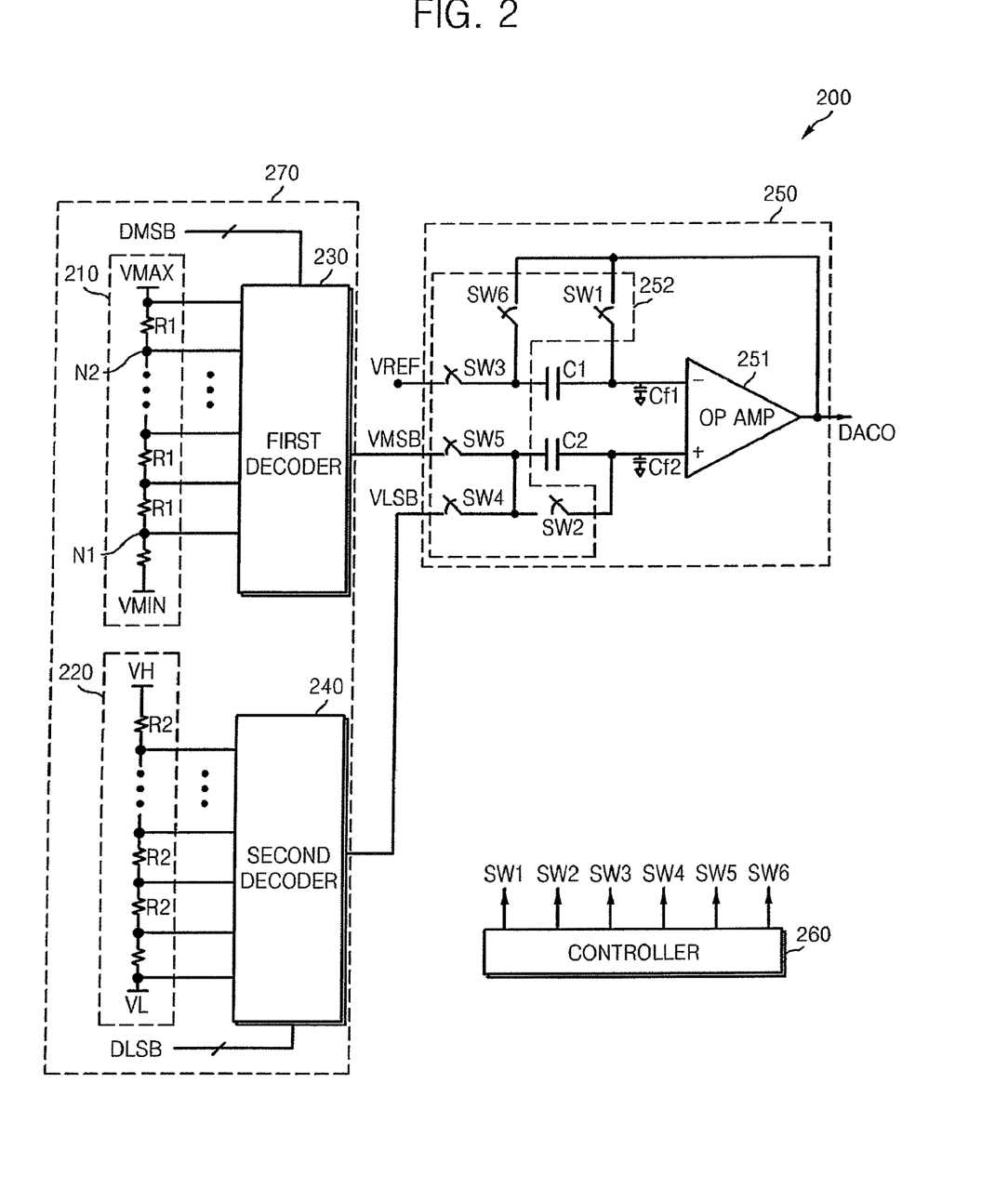
FIG. 2 is a circuit diagram illustrating a DAC according to an embodiment of the present general inventive concept.

FIG. 2 is a circuit diagram illustrating a digital-to-analog converter (DAC) 200 according to an embodiment of the present general inventive concept.

Referring to FIG. 2, the DAC 200 that may be embodied as an integrated circuit includes an amplifier 250 (which is also referred to as "switched capacitor amplifier"). The amplifier 250 includes a first capacitor C1, a second capacitor C2, an operation amplifier (OP AMP) 251, and a switching circuit 252. The DAC 200 is also referred to as a "resistor-capacitor DAC (RC-DAC)".

The operation amplifier 251 includes a first input terminal, e.g., a (−) input terminal, a second input terminal, e.g., a (+) input terminal, and an output terminal via which an output signal DACO is output.

The first capacitor C1 is connected to the first input terminal, e.g., the (−) input terminal, of the operation amplifier 251. The second capacitor C2 may be connected to the second input terminal, e.g., the (+) input terminal, of the operation amplifier 251.

The switching circuit 252 includes a first group of switches each being switched in response to a corresponding switching signal from among a first group of switching signals SW1, SW2, SW3 and SW4, and a second group of switches each being switched in response to a corresponding switching signal from among a second group of switching signals SW5 and SW6.

The first and second groups of the switches that constitute the switching circuit 252 may be embodied as transistors.

In detail, a first switch (switch that operates in response to the switching signal SW1) is connected between the first input terminal, e.g., the (−) input terminal, and the output terminal of the operation amplifier 251, and a second switch (switch that operates in response to the switching signal SW2) is connected in parallel to the second capacitor C2.

A third switch (switch that operates in response to the switching signal SW3) selectively transmits a first voltage, e.g., a reference voltage VREF, to a first terminal of the first capacitor C1, the third switch being connected between the first terminal of the first capacitor C1 and a node to receive the first voltage, e.g., the reference voltage VREF.

A fourth switch (switch that operates in response to the switching signal SW4) selectively transmits a second voltage to a first terminal of the second capacitor C2, and a fifth switch (switch that operates in response to the switching signal SW5) selectively transmits a third voltage to the first terminal of the second capacitor C2.

The first voltage may be the predetermined reference voltage VREF. In the current embodiment, the second voltage is a lower output voltage VLSB and the third voltage is an upper output voltage VMSB. However, the second voltage may be the upper output voltage VMSB and the third voltage may be the lower output voltage VLSB.

A sixth switch (switch that operates in response to the switching signal SW6) is connected between the first terminal of the first capacitor C1 and the output terminal of the operation amplifier 251.

A first parasitic capacitor Cf1 is a capacitor that is parasitic between the first input terminal, e.g., the (−) input terminal, of the operation amplifier 251 and ground. A second parasitic capacitor Cf2 is a capacitor that is parasitic between the second input terminal, e.g., the (+) input terminal, of the operation amplifier 251 and the ground. However, for symmetry of the parasitic capacitances between the input terminals of the operation amplifier 251, the amplifier 250 may further include a capacitor that is artificially connected to the first input terminal and/or the second input terminal of the operation amplifier 251.

The DAC 200 may further include a controller 260 that generates the first and second groups of the switching signals SW1, SW2, SW3, SW4, SW5 and SW6.

The timing of the first and second groups of switching signals SW1, SW2, SW3, SW4, SW5 and SW6 will later be described with reference to FIG. 5.

The DAC 200 may further include a signal conversion block 270. The signal conversion block 270 includes a first voltage divider 210, a second voltage divider 220, a first decoder 230, and a second decoder 240.

The first voltage divider 210 may include of a string of resistors including a plurality of first resistors R1 connected in series. In detail, in order to generate a plurality of first divided voltages, the first voltage divider 210 may be embodied as a string of resistors connected between a first node to receive a first reference voltage VMAX and a second node to receive a second reference voltage VMIN. For example, VMAX>VMIN. The resistance values of the first resistors R1 constituting the first voltage divider 210 may be the same.

The second voltage divider 220 may be embodied as a string of resistors including a plurality of second resistors R2 connected in series. In detail, in order to generate a plurality of second divided voltages, the second voltage divider 220 may be embodied as a string of resistors connected between a third node to receive a third reference voltage VH and a fourth node to receive a fourth reference voltage VL. For example, VH>VL. The resistance values of the second resistors R2 constituting the second voltage divider 220 may be the same.

The first decoder 230 selects one of the first divided voltages and outputs an upper output voltage VMSB, in response to a first digital signal (upper data DMSB) of an input received digital signal DATA.

The second decoder 240 selects one of the second divided voltages and outputs a lower output voltage VLSB, in response to a second digital signal (lower data DLSB) of the digital signal DATA.

The digital signal DATA that includes the upper data DMSB and the lower data DLSB, may be an n-bit parallel image signal (n is a natural number, e.g., 10, 12, or a number greater than 12). The upper data DMSB is an upper m-bit data of the n-bit digital signal DATA, and the lower data DLSB is a lower k-bit data of the n-bit digital signal DATA. Here, m is an integer greater than 1 and less than n. For example, m=n/2. Also, k is an integer greater than 1 and less than n. For example, k=n/2. Accordingly, n=m+k.

If n-bit digital data is divided into upper n/2 bits and lower n/2 bits and the upper n/2 bits and the lower n/2 bits are separately decoded, the first voltage divider 210 outputs first divided voltages obtained by dividing a difference between the first reference voltage VMAX and the second reference voltage VMIN by $2^{n/2}$, and the first decoder 230 selects one of the first divided voltages and outputs the selected voltage. Also, the second voltage divider 220 outputs second divided voltages obtained by dividing a difference between the third reference voltage VH and the fourth reference voltage VL by $2^{n/2}$, and the second decoder 240 selects and outputs one of the second divided voltages.

It is assumed that the DAC 200 is used in a display device (not illustrated).

If the DAC 200 operates to output a voltage equal to or greater than a common voltage VCOM that is commonly applied to a plurality of unit pixels cell1 of the display device (which is also referred to as "high-part decoding"), the first reference voltage VMAX may be a supply voltage VDD and the second reference voltage VMIN may be the common voltage VCOM.

If the DAC 200 operates to output a voltage less than or equal to the common voltage VCOM that is commonly applied to the unit pixels cell1 of the display device (which is also referred to as "low-part decoding"), the first reference voltage VMAX may be the common voltage VCOM and the second reference voltage VMIN may be a ground voltage.

The second voltage divider 220 may be embodied so as to subdivide the difference between the voltage of a first node N1 of the first voltage divider 210 and the second reference voltage VMIN into $2^k$ voltage differences or to subdivide the difference between the first reference voltage VMAX (supply voltage VDD) and the voltage of a second node N2 into $2^k$ voltage differences.

Figure 3A:
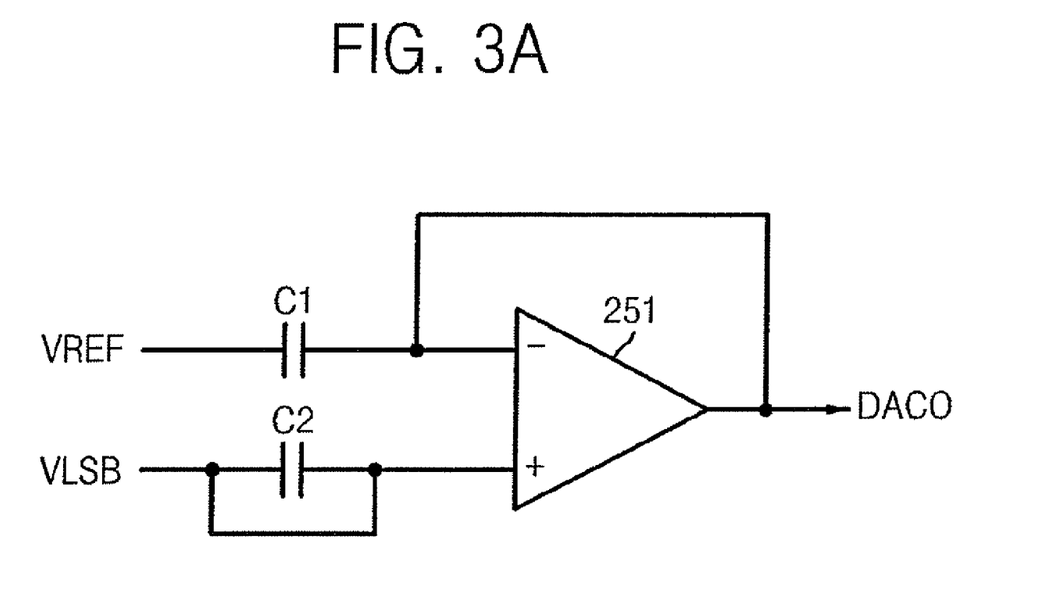
FIG. 3A is a circuit diagram illustrating a construction of a DAC in a first period, according to an embodiment of the present general inventive concept.
Figure 3B:
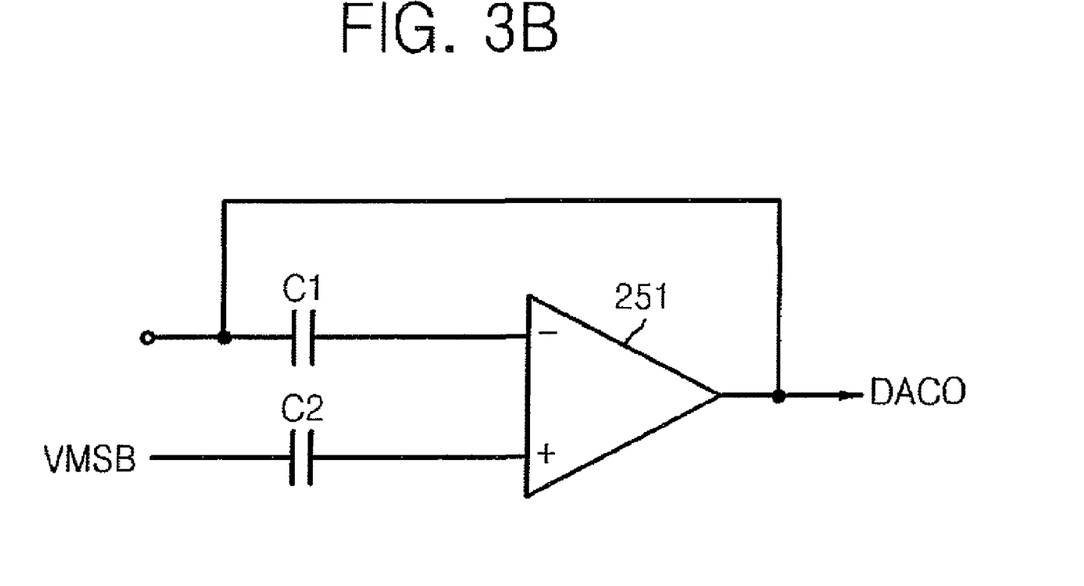
FIG. 3B is a circuit diagram illustrating a construction of a DAC in a second period, according to an embodiment of the present general inventive concept.

FIG. 3A is a circuit diagram illustrating a construction of a DAC in a first period, according to an embodiment of the present general inventive concept. FIG. 3B is a circuit diagram illustrating a construction of a DAC in a second period, according to an embodiment of the present general inventive concept.

Figure 4A:
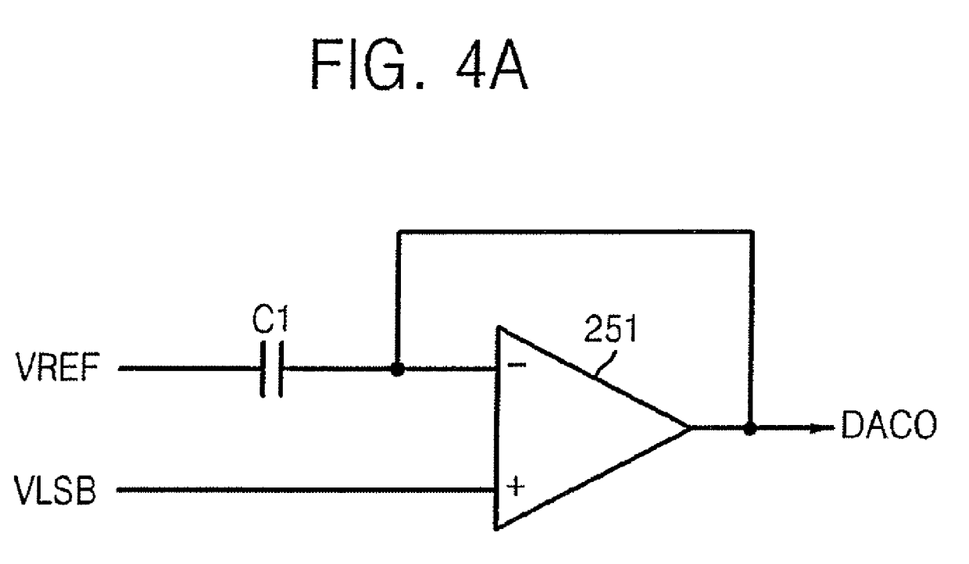
FIG. 4A is a circuit diagram illustrating a construction of a DAC in a first period, according to another embodiment of the present general inventive concept.
Figure 4B:
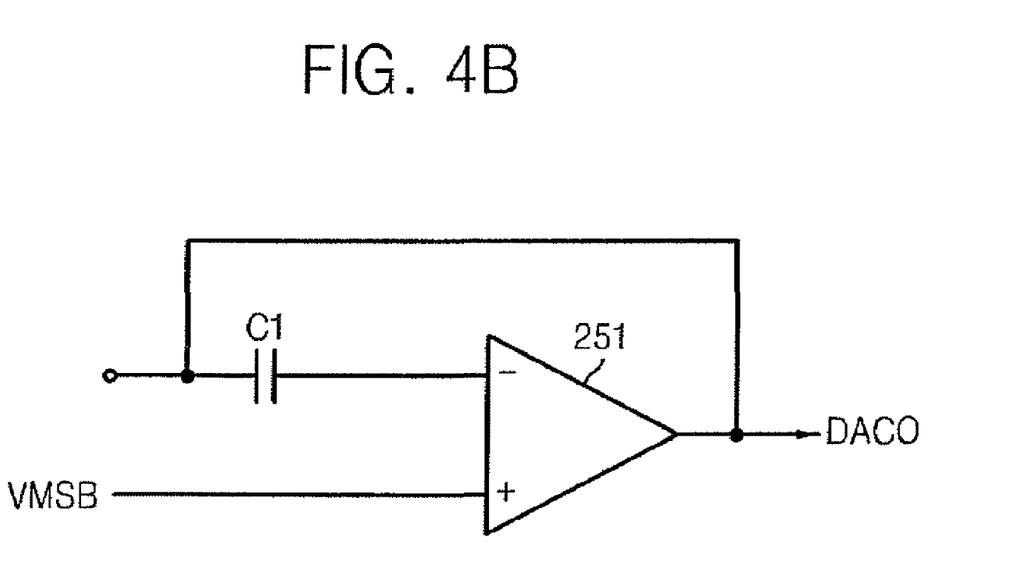
FIG. 4B is a circuit diagram illustrating a construction of a DAC in a second period, according to another embodiment of the present general inventive concept.
Figure 5:
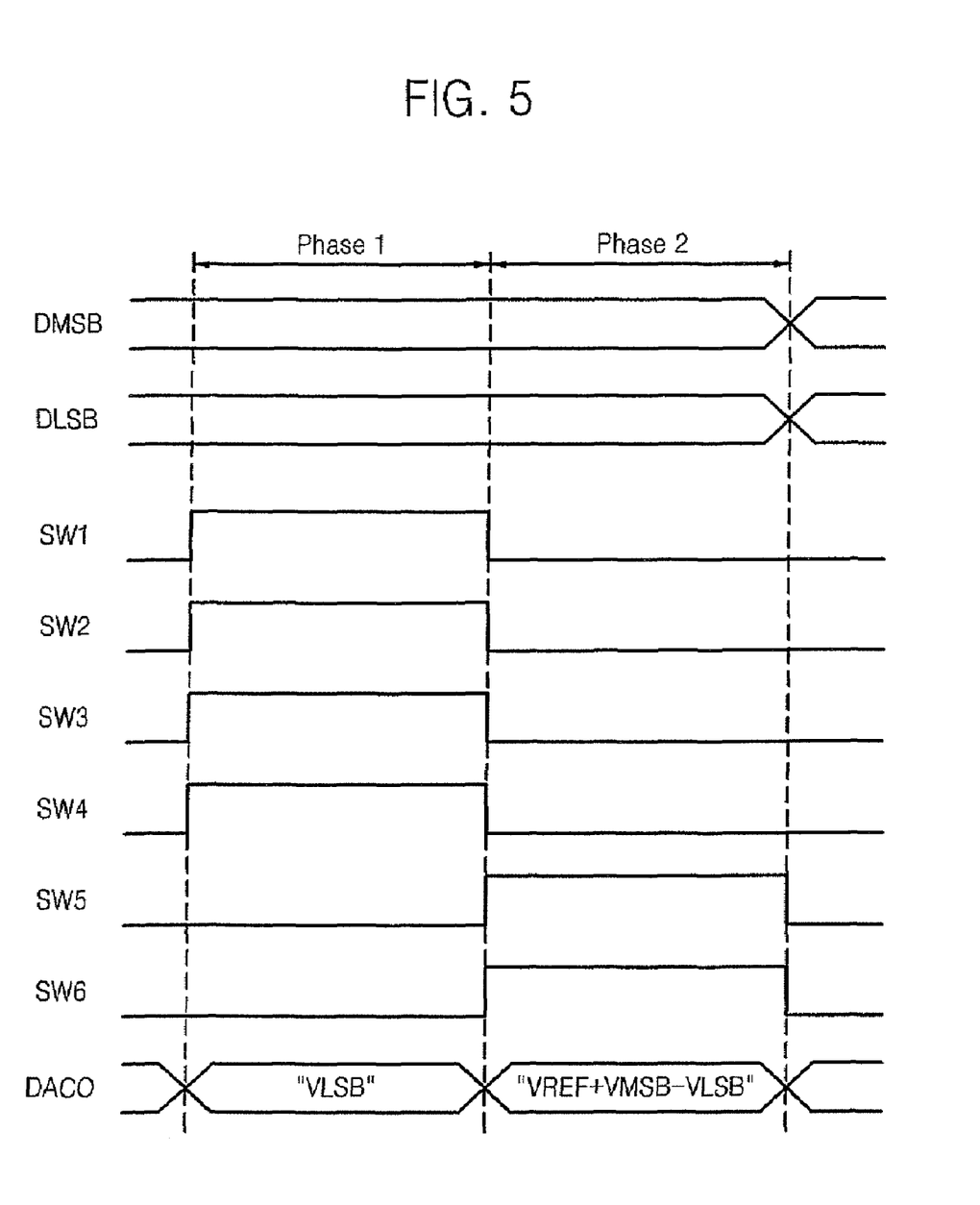
FIG. 5 is a timing diagram illustrating a plurality of switching signals and an output signal, according to an embodiment of the present general inventive concept.

FIG. 5 is a conceptual timing diagram illustrating a plurality of switching signals and an output signal, according to an embodiment of the present general inventive concept. The operations of a DAC in the first and second periods according to an embodiment of the present general inventive concept will be described with reference to FIGS. 2 through 5.

During the first period Phase1, the switching circuit 252 transmits a first voltage, e.g., a reference voltage VREF, to the first terminal of the first capacitor C1; transmits a second voltage (lower output voltage VLSB according to the current embodiment) to the second input terminal, e.g., the (+) input terminal, of the operation amplifier 251; and connects the first input terminal, e.g., the (−) input terminal, of the operation amplifier 251 to the output terminal of the operation amplifier 251.

To this end, during the first period Phase1, a first group of switching signals SW1, SW2, SW3 and SW4 are activated to logic "high", for example, and then the first group of the switches are closed and the second group of the are opened in response to the activated first group of the switching signals SW1, SW2, SW3 and SW4. Thus, as illustrated in FIG. 3A, during first period Phase1, the first input terminal, e.g., the (−) input terminal, of the operation amplifier 251 is connected to the output terminal, a reference voltage VREF is applied to the first terminal of the first capacitor C1, and then a lower output voltage VLSB is applied to the second input terminal, e.g., the (+) input terminal, of the operation amplifier 251.

Accordingly, the voltage of the second input terminal, e.g., the (+) input terminal, of the operation amplifier 251 becomes equal to the lower output voltage VLSB, and if an offset voltage between the first input terminal, e.g., the (−) input terminal, and second input terminal, e.g., the (+) input terminal, of an operation amplifier 251 is ignored (or if it is assumed that the offset voltage is zero), voltage of a signal DACO output from the operation amplifier 251 also becomes equal to the lower output voltage VLSB. Also, a difference VREF-VLSB between the reference voltage VREF and the lower output voltage VLSB is stored in the first capacitor C1.

For convenience of illustration, FIGS. 3A and 3B do not illustrate the first and second parasitic capacitors Cf1 and Cf2.

During the second period Phase2, the switching circuit 252 transmits a third voltage (upper output voltage VMSB according to the current embodiment) to the second input terminal, e.g., the (+) input terminal, of the operation amplifier 251, separates the first input terminal, e.g., the (−) input terminal, of the operation amplifier 251 from the output terminal of the operation amplifier 251, and connects the first terminal of the first capacitor C1 to the output terminal of the operation amplifier 251.

To this end, the first group of the switching signals SW1, SW2, SW3, and SW4 are deactivated to logic "low," for example, and then the first group of the switches are opened in response to these signals. Also, a second group of switching signals SW5 and SW6 are activated, and the second group of the switches are closed in response to these signals.

Thus, during the second period Phase2, as illustrated in FIG. 3B, the upper output voltage VMSB is applied to the first terminal of the second capacitor C2 connected to the second input terminal, e.g., the (+) input terminal, of the operation amplifier 251. If it is assumed that the coupling ratio of the second capacitor C2 is 1, that is, if 100% of a variation in the voltage of one terminal of the second capacitor C2 is delivered to the other terminal (second terminal) of the second capacitor C2, then the voltage of the second input terminal, e.g., the (+) input terminal, of the operation amplifier 251 becomes equal to the upper output voltage VMSB. Accordingly, if an offset voltage Voff between the first input terminal, e.g., the (−) input terminal, and the second input terminal, e.g., the (+) input terminal, of the operation amplifier 251 is ignored, the voltage of the first input terminal, e.g., the (−) input terminal, of the operation amplifier 251 also becomes equal to the upper output voltage VMSB.

Accordingly, if it is assumed that the coupling ratio of the first capacitor C1 is also 1, the output signal DACO output from the operation amplifier 251 has a value (VMSB+VREF−

VLSB) that is a sum of a value (VREF−VLSB) stored in the first capacitor C1 during the first period Phase1 and the upper output voltage VMSB.

Thus, the output signal DACO output from the operation amplifier 251 is a signal that reflects the lower output voltage VLSB based on lower data DLSB in the upper output voltage VMSB based on upper data DMSB.

Where the offset voltage Voff between the first input terminal, e.g., the (−) input terminal, and the second input terminal, e.g., the (+) input terminal, of the operation amplifier 251 is considered and will now be described with reference to FIGS. 3A and 3B.

During the first period Phase1, the voltage of the second input terminal, e.g., the (+) input terminal, of the operation amplifier 251 is equal to the lower output voltage VLSB, but the voltage of the first input voltage, e.g., the (−) input terminal, of the operation amplifier 251 is equal to a sum of the lower output voltage VLSB and the offset voltage Voff, i.e., (VLSB+Voff). Thus, the value (VREF−VLSB−Voff) is stored in the first capacitor C1.

After the first period Phase1, during the second period Phase2, the voltage of the second input terminal, e.g., the (+) input terminal, of the operation amplifier 251 is equal to the upper output voltage VMSB, and the voltage of the first input voltage, e.g., the (−) input voltage, of the operation amplifier 251 is equal to a sum of the upper output voltage VMSB and the offset voltage Voff, i.e., VMSB+Voff.

Therefore, the output signal DACO of the operation amplifier 251 is equal to (VMSB+VREF-VLSB) since the offset voltage Voff of the operation amplifier 251 is canceled.

As described above, according to the current embodiment, the offset voltage Voff of the operation amplifier 251 is canceled, thereby obtaining the output signal DACO that is digital-to-analog converted irrespective of the offset voltage Voff of the operation amplifier 251.

Conventionally, if digital data DATA is n bits long, $2^n$ resistors, $2^n$ metal lines, and a $2^n$:1 decoder are needed, where $2^n$=1024 if n is 10. However, according to the current embodiment, if it is assumed that m=k=n/2, a total numbers of resistors and metal lines are reduced to $2 \times 2^{(n/2)}$, and two $2^{(n/2)}$:1 decoders are needed, where $2^{(n/2)}$=256 if n is 10. Accordingly, a size of a DAC according to the present general inventive concept is less than that of a conventional DAC.

FIG. 4A is a circuit diagram illustrating a construction of a DAC in a first period, according to another embodiment of the present general inventive concept. FIG. 4B is a circuit diagram illustrating a construction of a DAC in a second period, according to another embodiment of the present general inventive concept.

The DAC illustrated in FIGS. 4A and 4B does not include the second capacitor C2, compared to the DAC illustrated in FIGS. 3A and 3B.

Operations of the DAC illustrated in FIGS. 4A and 4B according to another embodiment of the present general inventive concept are similar to those of the DAC illustrated in FIGS. 3A and 3B according to an embodiment of the present general inventive concept. Thus, a description of the operations of the DAC illustrated in FIGS. 4A and 4B will be omitted.

However, the DAC illustrated in FIGS. 3A and 3B has a symmetric structure in which the capacitors C1 and C2 respectively connected to the first and second input terminals, e.g., the (−) input terminal and the (+) input terminal, of the operation amplifier 251 are symmetrical with respect to each other. Thus, the output signal DACO that is digital-to-analog converted may not be influenced by the coupling ratios of the first and second capacitors C1 and C2 if the coupling ratios are almost the same. Alternative, the DAC illustrated in FIGS. 4A and 4B does not have such a symmetric structure. That is, capacitance of the first input terminals, e.g., the (−) input terminal is not same as capacitance of the second input terminal, e.g., the (+) input terminal. Thus, the DACO that is digital-to-analog converted may be influenced by the coupling ratio of the first capacitor C1.

For convenience of explanation, FIG. 5 illustrates that a first group of switching signals SW1, SW2, SW3, and SW4 are activated or deactivated while being synchronized with one another, and a second group of switching signals SW5 and SW6 are also activated or deactivated while being synchronized with one another. However, actually, these signals may not be synchronized with one another in consideration of switching noise and so on, or may be activated or deactivated at different times.

Figure 6:
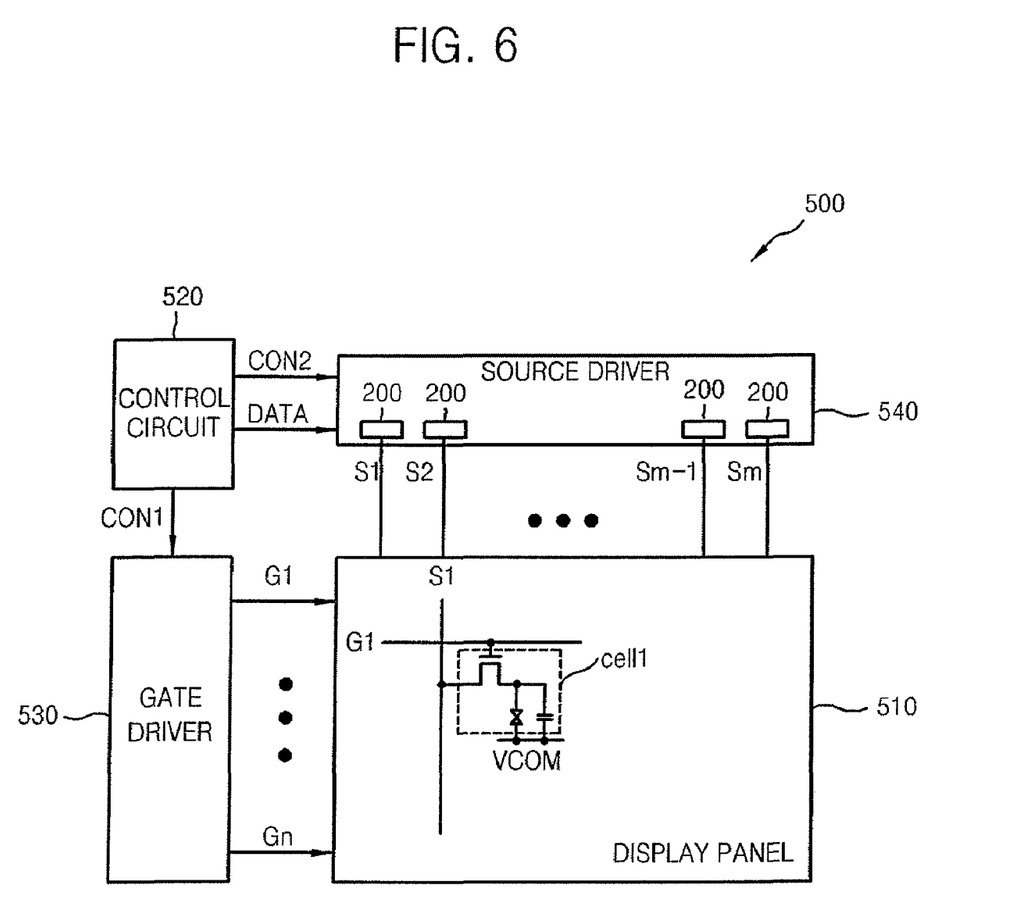
FIG. 6 is a block diagram illustrating a display device having a source driver that includes the DAC illustrated in FIG. 2, according to an embodiment of the present general inventive concept.

FIG. 6 is a block diagram illustrating a display device 500 having a source driver 540 that includes a plurality of DACs 200, such as that illustrated in FIG. 2, according to an embodiment of the present general inventive concept.

Referring to FIG. 6, the display device 500 which is a flat panel display device such as a thin film transistor-liquid crystal display (TFT-LCD), a plasma display panel (PDP), or an organic light emitting device (OLED), includes a display panel 510, a control circuit 520, a gate driver 530, and a source driver 540.

The display panel 510 includes a plurality of data lines S1 through Sm, a plurality of gate lines G1 through Gn, and a plurality of pixels including a unit pixel cell1, where m and n are natural numbers, and n=m or n≠m.

Each of the pixels is connected between a corresponding data line from among the data lines S1 through Sm and a corresponding gate line from among the gate lines G1 through Gn.

The control circuit 520 generates a plurality of control signals including a first control signal CON1 and a second control signal CON2. For example, the control circuit 520 may generate the first control signal CON1, the second control signal CON2, and digital image data DATA based on a horizontal synchronization signal and a vertical synchronization signal.

The gate driver 530 sequentially drives the gate lines G1 through Gn in response to the first control signal CON1. For example, the first control signal CON1 may be a signal to instruct starting of a scanning of the gate lines G1 through Gn.

The source driver 540 includes the plurality of the DACs 200 according to an embodiment of the present general inventive concept. Each of the DACs 200 is connected to a corresponding data line from among the data lines S1 through Sm. For example, an output signal DACO of the DAC 200 may be supplied to the data line S1. A driver that includes the DAC 200 and drives a data line may be referred to as a channel driver, and the data line may be referred to as a channel.

The source driver 540 drives the data lines S1 through Sm, in response to the second control signal CON2 and the digital image data DATA output from the control circuit 520.

Figure 7:
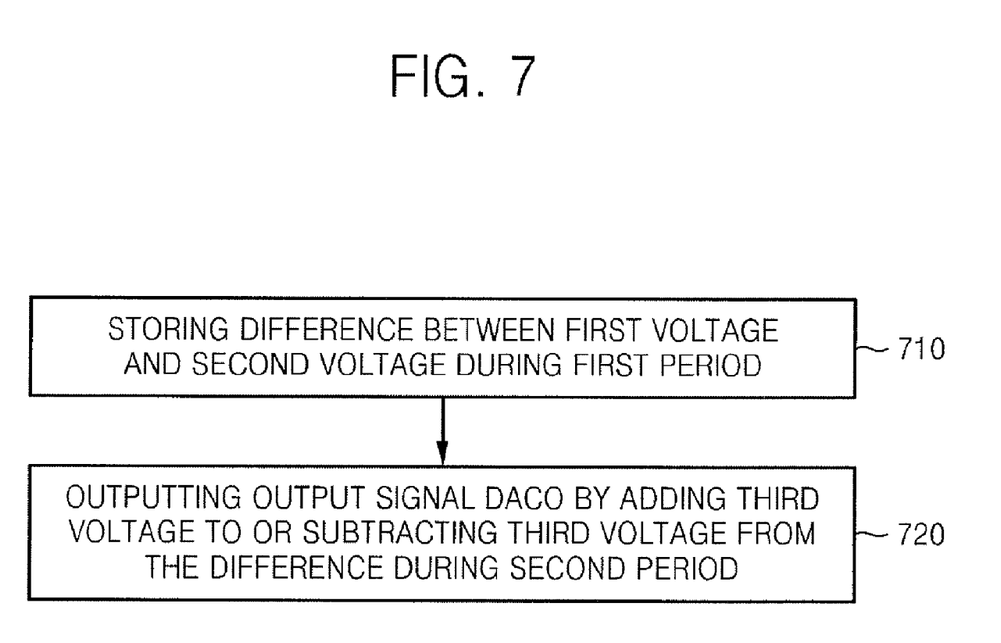
FIG. 7 illustrates a digital-to-analog converting method according to an embodiment of the present general inventive concept.

FIG. 7 illustrates a digital-to-analog converting method according to an embodiment of the present general inventive concept. Referring to FIG. 7, in operation 710, storing a difference between a first voltage, e.g., a reference voltage VREF, and a second voltage in a first capacitor C1 connected to the first input terminal, e.g., the (−) input terminal, of the operation amplifier 251, during a first period is performed; and, in operation 720, outputting an output signal DACO by adding a third voltage to or subtracting the third voltage from the difference stored in the first capacitor C1 during a second period is performed.

The first voltage is the predetermined reference voltage VREF, the second voltage is a voltage selected based on a first digital signal (upper data DMSB or lower data DLSB) that constitutes a digital signal DATA, and the third voltage is a voltage selected based on a second digital signal (lower data DLSB if the first digital signal is the upper data DMSB, and the upper data DMSB if the first digital signal is the lower data DLSB).

Also, a source driver module (not illustrated) according to an embodiment of the present general inventive concept may include a plurality of source drivers having a same structure as the source driver 540 illustrated in FIG. 6.

The present general inventive concept can also be embodied as computer-readable codes on a computer-readable medium. The computer-readable medium can include a computer-readable recording medium and a computer-readable transmission medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

As described above, according to various embodiments of the present general inventive concept, a total numbers of resistors and metal lines and a size of a decoder which are needed to embody a DAC can be reduced, thereby reducing a size (area) of the DAC.

Also, as described above, according to various embodiments of the present general inventive concept, it is possible to obtain a signal that is precisely digital-to-analog converted irrespective of an offset voltage of an operation amplifier of the DAC since an offset voltage of the operation amplifier is canceled.

Also, as described above, according to the various embodiments of the present general inventive concept, it is possible to obtain a signal that is precisely digital-to-analog converted irrespective of the coupling ratios of capacitors of the DAC.

Although various embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An integrated circuit, comprising:
   a first capacitor;
   an operation amplifier having a first input terminal connected to the first capacitor, a second input terminal, and an output terminal; and
   a switching circuit having a plurality of switches each being switched in response to a corresponding switching signal from among a plurality of switching signals,
   wherein the switching circuit transmits a first voltage to a first terminal of the first capacitor, transmits a second voltage to the second input terminal of the operation amplifier, and connects the first input terminal of the operation amplifier to the output terminal of the operation amplifier during a first period; and then transmits a third voltage to the second input terminal of the operation amplifier, separates the first input terminal of the operation amplifier from the output terminal of the operation amplifier, and connects the first terminal of the first capacitor to the output terminal of the operation amplifier during a second period.

2. The integrated circuit of claim 1, further comprising:
   a second capacitor connected to the second input terminal of the operation amplifier,
   wherein during the second period, the switching circuit transmits the third voltage to a first terminal of the second capacitor so that the third voltage is to be transmitted to the second input terminal of the operation amplifier via the second capacitor, and
   wherein the first input terminal is a (−) input terminal and the second input terminal is a (+) input terminal.

3. The integrated circuit of claim 2, further comprising:
   a first voltage divider having a string of resistors connected between a first node to receive a first reference voltage and a second node to receive a second reference voltage, the first voltage divider to generate a plurality of first divided voltages;
   a second voltage divider having a string of resistors connected between a third node to receive a third reference voltage and a fourth node to receive a fourth reference voltage, the second voltage divider to generate a plurality of second divided voltages;
   a first decoder to output one of the first divided voltages as the second or third voltage, in response to a first digital signal which constitutes an input digital signal; and
   a second decoder to select one of the second divided voltages and to output the selected voltage as the third or second voltage, in response to a second digital signal which constitutes the digital signal,
   wherein the digital signal includes the first and second digital signals.

4. The integrated circuit of claim 3, wherein:
   the first voltage is a predetermined reference voltage,
   the first digital signal includes one or more upper bits of the first and second digital signals, and
   the second digital signal includes one or more lower bits of the first and second digital signals.

5. The integrated circuit of claim 3, wherein:
   the first voltage is a common voltage which is commonly applied to unit cells of a display device,
   the first reference voltage is a supply voltage or the common voltage, and
   the second reference voltage is the common voltage or a ground voltage.

6. The integrated circuit of claim 2, wherein the switching circuit comprises:
   a first switch connected between the first input terminal and the output terminal of the operation amplifier;
   a second switch connected in parallel to the second capacitor;
   a third switch to transmit the first voltage to the first terminal of the first capacitor;
   a fourth switch to transmit the second voltage to the first terminal of the second capacitor;
   a fifth switch to transmit the third voltage to the first terminal of the second capacitor; and
   a sixth switch being connected between the first terminal of the first capacitor and the output terminal of the operation amplifier.

7. The integrated circuit of claim 6, wherein:
the first through fourth switches are closed and the fifth and sixth switches are opened during the first period, and
the first through fourth switches are opened and the fifth and sixth switches are closed during the second period.

8. The integrated circuit of claim 1, further comprising:
a controller to output the plurality of the switching signals.

9. The integrated circuit of claim 1, wherein the integrated circuit is a digital-to-analog converter.

10. A source driver usable with a display device, the source driver comprising:
a first capacitor;
an operation amplifier having a first input terminal connected to the first capacitor,
a second input terminal, and an output terminal; and
a switching circuit having a plurality of switches each being switched in response to a corresponding switching signal from among a plurality of switching signals,
wherein the switching circuit transmits a first voltage to a first terminal of the first capacitor, transmits a second voltage to the second input terminal of the operation amplifier, and connects the first input terminal of the operation amplifier to the output terminal of the operation amplifier during a first period; and then transmits a third voltage to the second input terminal of the operation amplifier, separates the first input terminal of the operation amplifier from the output terminal of the operation amplifier, and connects the first terminal of the first capacitor to the output terminal of the operation amplifier during a second period.

11. A display device, comprising:
a plurality of pixels having a plurality of data lines and a plurality of gate lines, where each of the pixels is connected between a corresponding data line from among the data lines and a corresponding gate line from among the gate lines; and
a source driver, comprising:
a first capacitor;
an operation amplifier having a first input terminal connected to the first capacitor,
a second input terminal, and an output terminal; and
a switching circuit having a plurality of switches each being switched in response to a corresponding switching signal from among a plurality of switching signals,
wherein the switching circuit transmits a first voltage to a first terminal of the first capacitor, transmits a second voltage to the second input terminal of the operation amplifier, and connects the first input terminal of the operation amplifier to the output terminal of the operation amplifier during a first period; and then transmits a third voltage to the second input terminal of the operation amplifier, separates the first input terminal of the operation amplifier from the output terminal of the operation amplifier, and connects the first terminal of the first capacitor to the output terminal of the operation amplifier during a second period;
wherein a voltage of the output terminal of the operation amplifier is applied to a corresponding data line from among the data lines.

12. The display device of claim 11, further comprising:
a second capacitor connected to the second input terminal of the operation amplifier,
wherein the switching circuit transmits the third voltage to the first terminal of the second capacitor during the second period so that the third voltage is to be transmitted to the second input terminal of the operation amplifier via the second capacitor.

13. The display device of claim 11, further comprising:
a first voltage divider having a string of resistors connected between a first node to receive a first reference voltage and a second node to receive a second reference voltage, the first voltage divider generating a plurality of first divided voltages;
a second voltage divider having a string of resistors connected between a third node to receive a third reference voltage and a fourth node to receive a fourth reference voltage, the second voltage divider generating a plurality of second divided voltages;
a first decoder to output one of the first divided voltages as the second or third voltage, in response to a first digital signal that constitutes an input digital signal; and
a second decoder to select one of the second divided voltages and to output the selected voltage as the third or second voltage, in response to a second digital signal which constitutes the digital signal,
wherein the digital signal includes the first and second digital signals.

14. A digital-to-analog converting method, the method comprising:
storing a difference between a first voltage corresponding to a predetermined reference voltage and a second voltage based on a first digital signal in a first capacitor connected to a first input terminal of an operation amplifier during a first period; and
outputting an output signal by adding a third voltage based on a second digital signal to or subtracting the third voltage from the difference stored in the first capacitor during a second period.

15. The method of claim 14, wherein:
the first digital signal comprises:
one or more upper bits of the first and second digital signals, and
the second digital signal comprises:
one or more lower bits of the first and second digital signals.

16. The method of claim 15, further comprising:
generating a plurality of first divided voltages by using a string of resistors to receive a first reference voltage and a second reference voltage;
generating a plurality of second divided voltages by using a string of resistors to receive a third reference voltage and a fourth reference voltage;
selecting one of the first divided voltages and outputting the selected voltage as the second or third voltage, in response to the first digital signal; and
selecting one of the second divided voltages and outputting the selected voltage as the third or second voltage, in response to the second digital signal.

17. The method of claim 14, wherein the storing of the difference between the first and second voltages in the first capacitor comprises:
transmitting the first voltage to a first terminal of the first capacitor, transmitting the second voltage to a second input terminal of the operation amplifier, and connecting the first input terminal of the operation amplifier to an output terminal of the operation amplifier, during the first period, and
the outputting of the output signal by adding the third voltage to or subtracting the third voltage from the difference stored in the first capacitor comprises:
transmitting the third voltage to the second input terminal of the operation amplifier, separating the first input terminal of the operation amplifier from the output terminal of the operation amplifier, and connecting the first terminal of the first capacitor to the output terminal of the operation amplifier, during the second period.

18. A computer-readable recording medium having embodied thereon a computer program to execute a method of claim 14, wherein the method comprises:

storing a difference between a first voltage corresponding to a predetermined reference voltage and a second voltage based on a first digital signal in a first capacitor connected to a first input terminal of an operation amplifier during a first period; and outputting an output signal by adding a third voltage based on a second digital signal to or subtracting the third voltage from the difference stored in the first capacitor during a second period.

* * * * *

UNITED STATES PATENT AND TRADEMARK OFFICE
CERTIFICATE OF CORRECTION

PATENT NO. : 7,595,747 B2 Page 1 of 1
APPLICATION NO. : 11/971320
DATED : September 29, 2009
INVENTOR(S) : Yun Seung Shin et al.

It is certified that error appears in the above-identified patent and that said Letters Patent is hereby corrected as shown below:

On the Title page, Section (73) Assignee: "Samsung Electroncis Co., Ltd." should be changed to "Samsung Electronics Co., Ltd."

Signed and Sealed this

Twelfth Day of October, 2010

David J. Kappos
*Director of the United States Patent and Trademark Office*